United States Patent
Kwak et al.

(10) Patent No.: US 9,382,630 B2
(45) Date of Patent: Jul. 5, 2016

(54) ZINC ALLOY COATED STEEL SHEET HAVING GOOD SEALER ADHESION AND CORROSION RESISTANCE AND PROCESS OF MANUFACTURING THE SAME

(75) Inventors: Young-Jin Kwak, Gwangyang (KR); Dong-Yoeul Lee, Gwangyang (KR); Kyung-Hoon Nam, Gwangyang (KR); Sang-Cheol Lee, Gwangyang (KR); Yong-Hwa Jung, Gwangyang (KR); Woo-Sung Jung, Gwangyang (KR); Sang-Hoon Park, Gwangyang (KR); Tae-Yeob Kim, Gwangyang (KR); Gwang-Seok Kim, Gwangyang (KR)

(73) Assignee: POSCO, Pohang-si (KR)

( * ) Notice: Subject to any disclaimer, the term of this patent is extended or adjusted under 35 U.S.C. 154(b) by 0 days.

(21) Appl. No.: 12/810,853

(22) PCT Filed: Dec. 23, 2008

(86) PCT No.: PCT/KR2008/007617
§ 371 (c)(1), (2), (4) Date: Jun. 28, 2010

(87) PCT Pub. No.: WO2009/084848
PCT Pub. Date: Jul. 9, 2009

(65) Prior Publication Data
US 2010/0285333 A1   Nov. 11, 2010

(30) Foreign Application Priority Data
Dec. 28, 2007 (KR) .................. 10-2007-0140474

(51) Int. Cl.
*C23C 14/00* (2006.01)
*C23C 28/02* (2006.01)
(Continued)

(52) U.S. Cl.
CPC ............... *C23C 28/025* (2013.01); *C23C 2/06* (2013.01); *C23C 2/26* (2013.01); *C23C 2/28* (2013.01); *C23C 14/025* (2013.01);
(Continued)

(58) Field of Classification Search
USPC ................................ 427/430.1, 435, 543, 532
See application file for complete search history.

(56) References Cited

U.S. PATENT DOCUMENTS 5,135,817 A * 8/1992 Shimogori et al. ........... 428/621
5,747,111 A * 5/1998 Fukui et al. ................... 427/250
(Continued)

FOREIGN PATENT DOCUMENTS

DE    EP 0756022 A2 *  1/1997 ............... C23C 2/26
EP    0756022 A2       1/1997
(Continued)

OTHER PUBLICATIONS

Google translation of EP 0756022 A2.*
(Continued)

*Primary Examiner* — David Turocy
(74) *Attorney, Agent, or Firm* — The Webb Law Firm

(57) ABSTRACT

There is provided a zinc alloy coated steel sheet including a vacuum deposited layer capable of improving corrosion resistance and sealer adhesion that are suitable for the use in automobiles, and a process of manufacturing the same. The zinc alloy coated steel sheet includes a zinc coating layer formed on a steel sheet; and a zinc/metal alloy deposited layer formed on the zinc coating layer, wherein the zinc coating layer, and a metal diffusion layer is present in the zinc coating layer.

5 Claims, 1 Drawing Sheet

(51) Int. Cl.
  *C23C 14/58* (2006.01)
  *C23C 14/54* (2006.01)
  *C23C 14/02* (2006.01)
  *C23C 2/06* (2006.01)
  *C23C 2/26* (2006.01)
  *C23C 2/28* (2006.01)
  *C23C 14/16* (2006.01)

(52) U.S. Cl.
  CPC .............. *C23C 14/027* (2013.01); *C23C 14/16* (2013.01); *C23C 14/548* (2013.01); *C23C 14/5806* (2013.01); *C23C 28/021* (2013.01); *C23C 28/028* (2013.01); *Y10T 428/12799* (2015.01)

(56) References Cited

U.S. PATENT DOCUMENTS

| | | | |
|---|---|---|---|
| 2005/0064110 A1* | 3/2005 | Schade Van Westrum et al. | 427/591 |
| 2008/0190908 A1 | 8/2008 | Priede et al. | |
| 2010/0003538 A1 | 1/2010 | Nikolov et al. | |

FOREIGN PATENT DOCUMENTS

| | | | | |
|---|---|---|---|---|
| JP | 60110859 | A | * | 6/1985 |
| JP | 61213364 | A | * | 9/1986 |
| JP | 2170987 | A | | 7/1990 |
| JP | 05222518 | A | | 8/1993 |
| JP | 6017233 | A | | 1/1994 |
| JP | 7268604 | A | | 10/1995 |
| JP | 8060342 | A | | 3/1996 |
| JP | 8134632 | A | | 5/1996 |
| JP | 9078229 | A | | 3/1997 |
| JP | 10317125 | A | | 12/1998 |
| KR | 940000278 | B1 | * | 1/1994 |
| KR | 1020040085192 | A | | 10/2004 |
| KR | 1020070067097 | A | | 6/2007 |
| WO | 2007135092 | A1 | | 11/2007 |

OTHER PUBLICATIONS

English Abstract KR 940000278 B1.*

Schuhmacher, B. et al., "Novel coating systems based on PVD for steel sheet", Vakuum in Forschung und Praxis, 2001, pp. 233-235, Wiley-VCH Verlag GmbH, Weinheim, DE.

* cited by examiner

ZINC ALLOY COATED STEEL SHEET
HAVING GOOD SEALER ADHESION AND
CORROSION RESISTANCE AND PROCESS
OF MANUFACTURING THE SAME

TECHNICAL FIELD

The present invention relates to a zinc coated steel sheet used in the application field of automobiles and a process of manufacturing the same, and more particularly, to a zinc alloy coated steel sheet obtained by coating a zinc coated steel sheet with a thin film using a vacuum vapor deposition, followed by undergoing alloying heat treatment of the vacuum-deposited steel sheet and a process of manufacturing the same.

BACKGROUND ART

Surface treatment/coating technologies have been used to provide characteristics that iron materials does not have. Wet surface treatment technologies represented by electroplating and hot plating have been widely used in the field of surface treatment of steel, but there have been attempts to apply and incorporate dry surface treatment technologies such as chemical vapor deposition (CVD) and physical vapor deposition (PVD) in the early 1980s. It has been known that it is difficult for conventional PVD and CVD processes to apply to the field of steel productions in consideration of workability and productivity associated with a coating rate and a thin film forming rate. However, developments for high-speed plating technology have been recently promoted by a group of advanced steel makers to secure productivity and cost leadership.

Steel sheets that have been used as the steel sheets for automobiles may be mainly divided into three groups: an electro-galvanized steel sheet, a hot-dip galvanized steel sheet and a galvannealed steel sheet. The electro-galvanized steel sheet has been used for an outer body plate for automobiles since it has excellent surface appearance. However, the electro-galvanized steel sheet has been decreasingly used because it is not favorable in terms of the workability in post-plating process, the manufacturing cost and the surrounding conditions.

The hot-dip galvanized steel sheet is cheaper than the electro-galvanized steel sheet in terms of the manufacturing cost, but has inferior properties, such as mechanical properties, coating adhesion in a molding process, spot weldability of electrode in a continuous impact test, to the electro-galvanized steel sheet due to the post-plating process. Also, the galvannealed steel sheet has superior properties, such as coating adhesion in a painting process and spot weldability of electrode, to the electro-galvanized steel sheet and the hot-dip galvanized steel sheet since a Fe—Zn-based inter-metallic compound is formed by an alloying reaction of zinc with base iron. However, a powdering problem associated with peeling-off of a coating layer from a steel sheet in a processing process may arise due to the presence of Fe—Zn-based alloy phase (gamma phase) formed during the alloying reaction.

Also, when a sealer used for waterproof purpose, corrosion prevention, vibration absorption and welding is pasted onto a steel sheet, the cohesive failure of an adhesive where the sealer is peeled off in an impact peel test and a shear strength test does not occur after the adhesion of the steel sheet by the sealer, but the cohesive failure of a coated steel sheet in which a Zn—Fe coating layer is peeled off may occur due to the alloy phase formed between Fe and Zn. Therefore, there is an urgent demand for development of a coated steel sheet satisfying all the properties such as moldability, spot weldability, paintability and corrosion resistance.

However, the above-mentioned coated steel sheet has difficulties in satisfying all the requirements that the steel sheets for automobiles should have. Therefore, vacuum deposition processes (i.e. resistance heating, magnetron sputtering, electron gun, ion plating processes) are used in addition to the conventional coating processes (i.e. electro-galvanizing, hot-dipping processes) to coat and alloy a thin coating material. However, the deposition processes have problems associated with slow deposition rate, low deposition yield, and low energy efficiency.

As the known technologies to obtain the above-mentioned coated steel sheet, there are Japanese Patent Laid-open Publication Nos. 1996060342, 1996134632, 1997-078229 and 1998-317125. These prior-art patent literatures disclose technologies of preparing a Zn—Mg alloy coated steel sheet having excellent adhesion to a coating layer and high corrosion resistance by depositing Zn onto a steel sheet using resistance heating deposition, depositing Mg onto the Zn-deposited steel sheet and heat-treating the Zn/Mg-deposited steel sheet. In this case, the resultant Zn—Mg alloy coated steel sheet has improved adhesion to a Zn—Mg alloy coating layer due to the presence of a Zn—Fe alloy layer or Zn—Fe—Mg alloy, and also shows its processability and corrosion resistance. However, these technologies disclosed in the prior-art patent literatures are not desirable in terms of economical efficiency due to the demand for the various deposition and alloying processes, and the cohesive failure of the coating layer may be caused in the sealer adhesion test due to the presence of the alloy phase formed between Fe and Zn during the alloying process. As another known technology, European Publication No. 0 756 022 discloses a method for preparing a zinc-based alloy coated steel sheet by depositing a metal element such as Fe, Mn, Cu, Mg and Ni onto a hot-dip galvanized or electro-galvanized steel sheet with a thickness of 0.1 to 3 micrometers ($\mu m$) by using electron-beam evaporation or magnetron evaporation, and alloying the metal element and the hot-dip galvanized or electro-galvanized steel sheet. In the case of the technology, the cohesive failure of an adhesive where the sealer is peeled off in an impact peel test and a shear strength test does not occur after the adhesion of the steel sheet by the sealer, but the cohesive failure of a coated steel sheet in which a Zn—Fe coating layer is peeled off may still occur due to the alloy phase formed between Fe and Zn when zinc and a thin film coating material are subject to the alloying process.

The present invention is designed to solve the problems of the prior art, and therefore it is an object of the present invention to provide a high-corrosion resistance zinc alloy coated steel sheet having good sealer adhesion and corrosion resistance.

Also, it is an object of the present invention to provide a process of manufacturing a zinc alloy coated steel sheet having good sealer adhesion and corrosion resistance.

SUMMARY OF THE INVENTION

According to an aspect of the present invention, there is provided a zinc alloy coated steel sheet having good sealer adhesion and corrosion resistance, including a zinc coating layer formed on a steel sheet; and a zinc/metal alloy deposited layer formed on the zinc coated layer, wherein a metal diffusion layer is present in the zinc coating layer.

According to another aspect of the present invention, there is provided a process of manufacturing a zinc alloy coated steel sheet having good sealer adhesion and corrosion resistance. Here, the method includes: depositing a zinc/metal alloy onto a zinc coated steel sheet to form a zinc/metal alloy deposited layer; and thermally treating the zinc coated steel sheet with the zinc/metal alloy deposited layer formed therein at a temperature from 250° C. (degrees Celsius) or more to less than 300° C.

In this case, the metal of the zinc/metal alloy may include a conductive metal, and the conductive metal may be at least one selected from the group consisting of Mg, Al, Mn, Cr, Cu, Ti and Ni.

Also, an alloy used for the deposition of the zinc/metal alloy deposited layer may include 90-95% by weight of at least one conductive metal selected from the group consisting of Mg, Al, Mn, Cr, Cu, Ti and Ni, and 5-10% by weight of Zn.

In addition, the zinc coating layer may have a thickness of 1.4 to 5 micrometers (um), the zinc/metal alloy deposited layer may have a thickness of 0.1 to 1 micrometers (um), and a metal diffusion layer formed between the zinc coating layer and the zinc/metal alloy deposited layer may have a thickness of 1 to 4 micrometers ($\mu$m). In this respect it is remarked that by the diffusion of part of the metal from the zinc/metal alloy deposited layer a metal diffusion layer is formed between the zinc coating layer and the zinc/metal alloy deposited layer or that the diffusion of the metal occurs over the total thickness of the zinc/metal alloy deposited layer resulting in a metal diffusion layer on top of a remainder of the zinc coating layer. The diffusion layer is again a zinc/metal alloy layer with a composition similar to that of the original zinc/metal alloy deposited layer.

Additionally, the depositing of the zinc/metal alloy onto the zinc coating steel sheet may be performed by levitating of floating a zinc/conductive metal alloy under a vacuum of $1\times10^{-2}$ to $1\times10^{-5}$ mbar by using an AC magnetic field. In the present description and claims the term levitation shall mean levitation and semi-levitation, wherein semi-levitation implies that there is a connection between the levitated material and the supply of material to replenish the amount of levitated material.

Furthermore, the thermally treating of the zinc coated steel sheet may be performed for 3 to 100 sec. using an induction heating or ultraviolet heating method.

In accordance with exemplary embodiments of the present invention, the zinc alloy coated steel sheet has high corrosion resistance and good sealer adhesion so as to secure the adhesion of a coating layer, and simultaneously exchange conventional post-plated zinc coated steel sheets for automobiles. Therefore, the zinc alloy coated steel sheet according to one exemplary embodiments of the present invention may be useful to apply to a coated steel sheet for automobiles that has high corrosion resistance and may be used in a potent structural adhesive that is a spot welding sealer for structure.

BEST MODE FOR CARRYING OUT THE INVENTION

Figure 1:
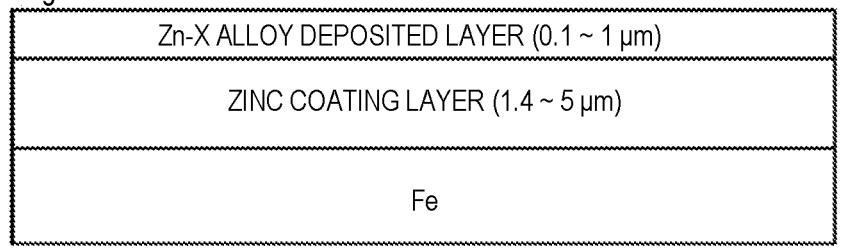
FIG. 1 is a diagram illustrating a steel sheet obtained by vapor-depositing a zinc-metal alloy onto a zinc coated steel sheet according to one exemplary embodiment of the present invention.
Figure 2:
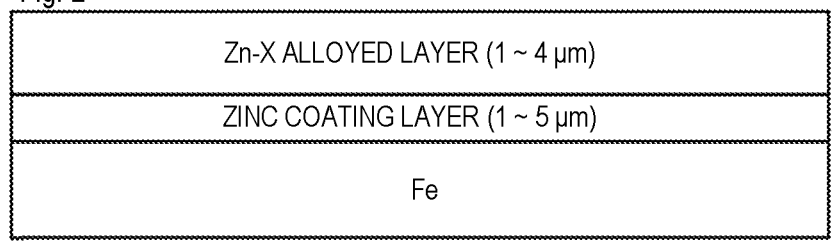
FIG. 2 is a diagram illustrating a steel sheet obtained after alloying heat treatment of a zinc coated steel sheet provided with a zinc/metal alloy deposited layer according to one exemplary embodiment of the present invention.

Hereinafter, the zinc alloy coated steel sheet and the process of manufacturing the same according to one exemplary embodiment of the present invention are described in more detail with reference to FIGS. 1 and 2. However, it is considered that the accompanying drawings are shown to illustrate exemplary embodiments of the present invention. Therefore, it may be evident to those skilled in the art that modifications and variations can be made without departing from the spirit and scope of the invention as defined by the appended claims. For the detailed description of the present invention, it is considered that the shapes and sizes of parts in the drawings may be shown exaggeratedly for clarity.

In accordance with one exemplary embodiment of the present invention, the zinc alloy coated steel sheet includes a base steel sheet, a zinc coating layer formed on the base steel sheet, and a zinc/metal alloy deposited layer formed on the zinc coating layer. Here, the zinc alloy coated steel sheet has a structure in which a zinc/iron alloy phase is not present in an interface between the base steel sheet and the zinc coating layer, and a diffusion layer of the metal is present in the coating layer.

In accordance with one exemplary embodiment of the present invention, the zinc coating layer formed on the base steel sheet. For example, an electro-galvanized steel sheet, a hot-dip galvanized steel sheet and so on may be used as the zinc coated steel sheet. In accordance with one exemplary embodiment of the present invention, the zinc coating layer preferably has a thickness of 1.4 micrometers ($\mu$m) or more. When the thickness of the zinc coating layer is less than 1.4 micrometers ($\mu$m), it is impossible to obtain a zinc coated steel sheet having a desired level of corrosion resistance. In consideration of the economical efficiency, the thickness of the zinc coating layer preferably is 5 micrometers ($\mu$m) or less, but the present invention is not particularly limited thereto.

A zinc/metal alloy deposited layer is formed on the zinc coating layer. The metal in the zinc/metal alloy deposited layer is preferably a conductive metal. Here, the conductive metal is selected in consideration that the deposition method is a deposition using an electrostatic levitator. Representative examples of the conductive metal may include, but are not particularly limited to, at least one metal selected from the group consisting of Mg, Al, Mn, Cr, Cu, Ti and Ni.

In accordance with one exemplary embodiment of the present invention, the metal in the zinc/metal alloy deposited layer is preferably at least one selected from the group consisting of Mg, Al, Mn, Cr, Cu, Ti and Ni. Most preferably, the zinc/metal alloy deposited layer includes 90-95% by weight of the conductive metal and 5-10% by weight of Zn. These contents are selected in consideration of the corresponding vapor pressure and temperature of the conductive metal and zinc.

In accordance with one exemplary embodiment of the present invention, the thickness of the zinc/metal alloy deposited layer is preferably in a range of 0.1 to 1 micrometers ($\mu$m). When the thickness of the zinc/metal alloy deposited layer is less than 0.1 micrometers ($\mu$m), it is difficult to expect improvement of corrosion resistance due to the innate roughness of the coated steel sheet. On the contrary, when the thickness of the alloy deposited layer exceeds 1 micrometers ($\mu$m), the corrosion resistance of the coated steel sheet is improved, but a powdering problem may be caused in processing the thick zinc/metal alloy deposited layer, also the thick zinc/metal alloy deposited layer is problematic in terms of the economical efficiency.

In accordance with one exemplary embodiment of the present invention, the zinc/iron alloy phase is not preferably present in the interface between the base steel sheet and the zinc coating layer. The absence of the zinc/iron alloy phase is selected in consideration of the sealer adhesion. In accordance with one exemplary embodiment of the present invention, a zinc/metal alloy layer formed between the zinc/metal alloy deposited layer and the zinc coating layer or from the zinc/metal alloy deposited layer and part of the zinc coating layer by diffusion of at least part of the metal into the zinc coating layer has a thickness of 1 to 4 micrometers (μm).

Hereinafter, the process of manufacturing a zinc alloy coated steel sheet according to one exemplary embodiment of the present invention is described in more detail.

In accordance with one exemplary embodiment of the present invention, a zinc/metal alloy deposited layer is formed by depositing a zinc/metal alloy onto a zinc coated steel sheet. Representative examples of the used zinc coated steel sheet include an electro-galvanized steel sheet, and a hot-dip galvanized steel sheet.

The zinc/metal alloy deposited layer may be formed by using one of the conventional vacuum vapor deposition methods such as electron beam, sputtering, thermal evaporation, inductive thermal evaporation, and ion plating methods. Preferably, the zinc/metal alloy deposited layer is formed by an electromagnetic induction heating method in which a zinc coated steel sheet may be deposited at a high speed in order to improve its productivity. The electromagnetic induction heating method is proposed in Korean Patent Laid-open Publication Nos. 2004-0085192 and 2007-0067097.

Since all the conventional vacuum vapor deposition methods are performed at a high treatment temperature, they have a problem in that a coating material to be gasified is always present in the form of liquid phase. Therefore, there is a limitation on a coating rate in the conventional vacuum vapor deposition methods. In the case of the electron beam evaporation using an electron gun, for example, the coating material should be present in a ceramic or copper crucible. In this case, attentions are paid that the copper crucible is intensively cooled with water so that copper cannot be molten or gasified in the vacuum vapor deposition methods. One of the disadvantages in cooling the copper crucible is the significant loss of heat during a cooling process. Also, the use of the ceramic crucible is limited to coating materials that do not chemically react with components of the crucible at a high temperature. Also, since most of the ceramic crucibles have a low thermal conductivity, it is difficult to supply heat energy to the ceramic crucibles. Therefore, the electromagnetic induction heating method is most preferred.

The vacuum vapor deposition using the electromagnetic induction heating method may be performed, as follows. When a high-frequency power is applied to an electromagnetic coil in a vacuum chamber to generate an electromagnetic force, zinc-based alloy materials, which will be coated onto a zinc coated steel sheet, are levitated in a space surrounded by an AC electromagnetic field. Here, the AC electromagnetic field is generated by AC high frequency current. When the coating materials to be gasified are levitated or semi-levitated, there is no need to use the conventional copper or ceramic crucible. Therefore, the coating materials to be gasified may be exposed to a higher temperature condition without any problems since the temperature does not limit the use of the crucible, which makes it possible to deposit a zinc-based alloy material at a high temperature. Conductive alloy materials are confined within an electromagnetic field by means of the Lorentz force in the AC electromagnetic field. Here, the Lorentz force is generated by interaction of an external electromagnetic field and an eddy current, which is induced by the conductive materials, thus to levitate the conductive materials in the AC electromagnetic field. In this case, the conductive materials are melted while being levitated. Therefore, a large amount of metal vapor is formed from the conductive alloy materials while they are kept levitated, and the metal vapor is sprayed through a nozzle of a vapor distribution box at a high rate so as to form a coating layer.

The vacuum vapor deposition is performed in a vacuum chamber with a pressure of $1.0 \times 10^{-2}$ to $5.0 \times 10^{-5}$ mbar according to one exemplary embodiment of the present invention. This vacuum vapor deposition is to realize a choking condition and a uniform coating layer.

For the coating process of the present invention, a levitated material is composed of an alloy of zinc and a conductive metal according to one exemplary embodiment of the present invention. Here, the conductive metal and Zn are preferably present at contents of 90-95% by weight and 5-10% by weight, respectively. Representative examples of the conductive metal may include at least one metal selected from the group consisting of Mg, Al, Mn, Cr, Cu, Ti and Ni. For example, a zinc/metal alloy deposited layer having a coating thickness of 0.1 to 1 μm is preferably deposited with a zinc/metal alloy material, which includes zinc (5 to 10 wt. %)-magnesium (90 to 95 wt. %), zinc (5 to 10 wt. %)-aluminum (90 to 95 wt. %), or zinc (5 to 10 wt. %)-manganese (90 to 95 wt. %), by using the physical vapor deposition (PVD) using an electrostatic levitator. This is why the above-mentioned levitated materials have different evaporation rates due to their innate vapor pressures. Therefore, the coated steel sheet may be coated with one of the levitated materials with a desired coating ratio by maintaining a compositional ratio of components in each levitated material to a suitable extent, depending on the vapor pressure/evaporation temperature of each levitated material, and a suitable compositional ratio of the components in each alloy material is one of important factors to supply and control a deposited material in a continuous coating process. Comparing temperatures of the components in each levitated material at a corresponding vapor pressure of $10^4$ Torr, aluminum, manganese, magnesium and zinc components have their evaporation temperatures of 1080° C. (degrees Celsius), 647° C., 327° C. and 250° C., respectively. From this result, it is revealed that a significant amount of zinc is evaporated at a low temperature. As a result, when the levitated materials having the above-mentioned compositional ratio is supplied and kept in a physical vapor deposition (PVD) process using an electrostatic levitator, zinc having the highest vapor pressure is deposited onto an electro-galvanized or zinc coated steel sheet, and the other components, such as aluminum, manganese and magnesium, having lower vapor pressure than zinc are thinly deposited at the substantially same time. In this case, a zinc-based alloy coated steel sheet, which is composed of zinc (less than 10 wt. %)-magnesium, aluminum and manganese (90 wt. % or more) to have good adhesion to a coating layer, may be manufactured from a gradient zinc-based alloy coating film in which a zinc content decreases from a surface of the zinc coated steel sheet. When the thickness of the alloy deposited layer is less than 0.1 micrometers (um), it is difficult to expect improvement of corrosion resistance due to the innate roughness of the electro-galvanized or zinc coated steel sheet. On the contrary, when the thickness of the zinc/metal alloy deposited layer exceeds 1 micrometers (um), the corrosion resistance of the electro-galvanized or zinc coated steel sheet is improved, but a powdering problem may be caused in processing the thick alloy deposited layer, also the thick zinc/metal alloy deposited layer is problematic in terms of the economical efficiency.

In accordance with one exemplary embodiment of the present invention, the zinc coated steel sheet having a zinc/metal alloy deposited layer formed therein is subject to the alloying heat treatment. An alloying treatment temperature is preferably maintained to a temperature from greater than 250° C. to less than 300° C. in order to cause the diffusion between the zinc/metal alloy deposited layer and the zinc coating layer at a temperature range where a brittle alloy phase (Fe-zinc) between the zinc coating layer and the base steel sheet does not occur. This is why the metal of the zinc/metal alloy deposited layer is not diffused into the zinc coated steel sheet at less than 250° C. or more than 300° C. If treatment takes place at a temperature higher than 300° C. a brittle intermetallic alloy phase between base iron and zinc will be formed which will result, when the coating layer is subjected to a sealer adhesion test, in Adhesive failure and the coating layer will be peeled off.

In accordance with one exemplary embodiment of the present invention, the alloying heat treatment may include an induction heating or UV-heating method. In this case, a heating time is preferably in a range of 3 to 100 sec. When the heating time is less than 3 sec, the diffusion process does not occur, whereas the alloying between the base steel sheet and the zinc coating layer proceeds when the heating time exceeds 100 sec.

Accordingly, exemplary embodiments of the present invention are described in more detail.

EXAMPLES

An electro-galvanized steel sheet (a zinc-coating thickness: 1.4 micrometers (um) or more) or a hot-dip galvanized steel sheet (a zinc-coating thickness: 5.0 micrometers (um) or more), which has been used for automobiles and has a thickness of 0.8 mm, was coated with an alloy material composed of zinc (5 to 10 wt. %) and magnesium (90 to 95 wt. %), zinc (5 to 10 wt. %) and aluminum (90 to 95 wt. %), or zinc (5 to 10 wt. %) and manganese (90 to 95 wt. %) in a vacuum chamber having a pressure of $1.0 \times 10^{-2}$ to $5.0 \times 10^{-5}$ mbar, by using a physical vapor deposition (PVD) method using an electrostatic levitator. This coating experiment was carried out with zinc-based alloy thin coating materials as listed in Table 1. The deposition methods such as resistance heating, magnetron sputtering or the like were used for Conventional examples of Table 1.

After the coating process, the zinc-based alloy coated steel sheet from the vacuum chamber was passed through an exit strip-lock and exposed to the air, and then heat-treated in a heat treatment zone, by using induction heat, as listed in Table 1. A zinc-based alloy coated steel sheet was prepared according to the varying thin film coating and heat treatment conditions, as listed in Table 1. In this case, a heat treatment time was in a range of 3 to 20 sec.

The zinc-based alloy coated steel sheets (Zn—Mg, Zn—Mn and Zn—Al) as prepared thus were evaluated for sealer adhesion, chipping resistance and corrosion resistance. Their results are listed in the following Table 1.

Here, the sealer adhesion was evaluated by applying a corrosion-resistant Hemming sealer adhesive M8514 (composed of epoxy resin, commercially available from GM) onto two 25×150 mm-sized steel sheets with an adhesion area of 25×12.5 mm and a coating thickness of 0.2 mm, baking the two steel sheets, and performing a tensile test on the steel sheets at a rate of 50 mm/min to observe fracture shapes of the steel sheets. In this case, the levels of the evaluated sealer adhesion are represented, as follows.

1: Good (Cohesive failure between sealers)
2: Mediocre (Interfacial failure between a coating layer and a sealer)
3: Poor (Cohesive failure in a coating layer)

The corrosion resistance of a coated steel sheet was evaluated after the coated steel sheet was drawn into a flat plate and cup. Here, a time point when the initial rusts are generated in seawater spraying test was recorded according to the standard JIS Z 2371, and used to perform a relative evaluation on a GI post-coated steel sheet (90 g/m$^2$) that has been used as a steel sheet for automobiles. In this case, the levels of the evaluated corrosion resistance are represented, as follows.

1: Good, 2: Mediocre (Level of GI 90 g/m$^2$), 3: Poor

The chipping resistance of a coated steel sheet was evaluated by treating the coated steel sheet with phosphate, electrodepositing the coated steel sheet with a coating thickness of approximately 23 micrometers (μm), disposing a test sample of the coated steel sheet spaced apart at a distance of 350 mm from a macadam-throwing aperture using a chipping resistance tester, installing the test sample (that is cooled to −20 degrees Celsius (° C.)) so that a shot material is arranged at an angle of 90 with respect to the test sample, and shooting the test sample at an air pressure of 4 kgf/cm$^2$ by using Macadam 7 (50 g±1 g) specified as macadam for road pavements. After the chipping resistance test, fractured and loose coating films were removed from the test sample using an adhesive tape, and the chipping resistance of the test sample was determined by comparison with the standard limited steel sheet sample using an Image Analyzer. In this case, the levels of the evaluated chipping resistance are represented, as follows.

1: Good (more than an equivalent level of GA)
2: Mediocre (an equivalent level of an electro-galvanized or hot-dip galvanized steel sheet)
3: Poor

TABLE 1

| Examples | | Thickness of Zn—X(μm) | | | Mg thickness (μm) | Content ratio of X in Zn—X (wt %) | Heat-treatment Temp. (° C.) | Quality evaluations | | |
|---|---|---|---|---|---|---|---|---|---|---|
| | | X = Mg | X = Al | X = Mn | | | | Sealer adhesion | chipping resistance | corrosion resistance |
| Conventional Ex. | 1 | — | — | — | 0.5 | | 300 | 3 | 1 | 1 |
| | 2 | — | — | — | 1 | | 400 | 3 | 1 | 1 |
| | 3 | — | — | — | 0.1 | | 350 | 3 | 1 | 2 |
| | 4 | — | — | — | 3 | | 300 | 3 | 1 | 1 |
| Comp. Ex. | 5 | 0.09 | — | — | | 95 | 250 | 1 | 2 | 3 |
| | 6 | 0.15 | — | — | | 90 | 300 | 3 | 1 | 1 |
| | 7 | 0.5 | — | — | | 93 | 310 | 3 | 1 | 1 |
| | 8 | 3 | — | — | | 90 | 350 | 3 | 1 | 1 |
| | 9 | — | 2 | — | | 90 | 300 | 3 | 1 | 1 |

TABLE 1-continued

|  | Examples | Thickness of Zn—X(μm) | | | Mg thickness (μm) | Content ratio of X in Zn—X (wt %) | Heat-treatment Temp. (° C.) | Quality evaluations | | |
|---|---|---|---|---|---|---|---|---|---|---|
|  |  | X = Mg | X = Al | X = Mn |  |  |  | Sealer adhesion | chipping resistance | corrosion resistance |
|  | 10 | — | 0.7 | — | — | 95 | 350 | 3 | 1 | 1 |
|  | 11 | — | 0.08 | — | — | 92 | 295 | 1 | 2 | 3 |
|  | 12 | — | 0.5 | — | — | 94 | 245 | 3 | 2 | 3 |
|  | 13 | — | — | 1.5 | — | 95 | 310 | 3 | 1 | 1 |
|  | 14 | — | — | 0.5 | — | 90 | 350 | 3 | 1 | 1 |
|  | 15 | — | — | 0.09 | — | 93 | 298 | 1 | 2 | 3 |
|  | 16 | — | — | 0.1 | — | 92 | 300 | 3 | 1 | 1 |
| Inventive Ex. | 17 | 0.1 | — | — | — | 90 | 250 | 1 | 1 | 1 |
|  | 18 | 1.0 | — | — | — | 93 | 290 | 1 | 1 | 1 |
|  | 19 | 0.5 | — | — | — | 95 | 270 | 1 | 1 | 1 |
|  | 20 | — | 0.3 | — | — | 95 | 280 | 1 | 1 | 1 |
|  | 21 | — | 0.7 | — | — | 93 | 290 | 1 | 1 | 1 |
|  | 22 | — | 1.0 | — | — | 90 | 250 | 1 | 1 | 1 |
|  | 23 | — | — | 1.0 | — | 70 | 260 | 1 | 1 | 1 |
|  | 24 | — | — | 0.6 | — | 60 | 275 | 1 | 1 | 1 |
|  | 25 | — | — | 0.1 | — | 50 | 255 | 1 | 1 | 1 |

As listed in Table 1, it was revealed that the Inventive examples 17 to 28 satisfying the requirements of the components in the coated steel sheet according to the present invention show their good characteristics such as significantly improved corrosion resistance and sealer adhesion.

On the contrary, it was shown that the Conventional examples 1 to 4 show their good corrosion resistance and chipping resistance when the coated steel sheet was coated with a thin coating (0.1-3 micrometers) of Mg and alloyed at a temperature of 300 to 400° C., but the cohesive failures of a coating layer occur in a sealer adhesion test since the Fe—Zn alloy phase is generated by an alloying reaction between zinc and a base steel sheet during the alloying process.

The Zn—Mg-coated Comparative example 5 did not show its improved corrosion resistance since a thin coating is not sufficiently formed to improve corrosion resistance. Comparative examples 6 to 8 had a thin coating layer and a Zn—Mg alloy coating layer that are formed sufficiently to improve corrosion resistance, but had a poor sealer adhesion since the undesirable Fe—Zn alloy phase between zinc and a steel sheet (Fe) is formed in the Zn—Mg alloying process.

The Zn—Al-coated Comparative examples 9, 10 and 12 had a thin coating layer and a Zn—Mg alloy coating layer that are formed sufficiently to improve corrosion resistance, but the cohesive failures of the coating layer were generated in the sealer adhesion test due to the Fe—Zn alloy phase between zinc and a steel sheet (Fe) formed in the Zn—Mg alloying process. In the case of the Comparative example 11, the thin coating layer did not have a sufficient thickness to improve corrosion resistance.

Like the above-mentioned the Zn—Mg and Zn—Al alloy coated steel sheets, the Zn—Mn-coated Comparative examples 13 and 14 also had a thin coating layer and a Zn—Mg alloy coating layer that are formed sufficiently to improve corrosion resistance, but the cohesive failures of the coating layer were generated in the sealer adhesion test due to the Fe—Zn alloy phase between zinc and a steel sheet (Fe) formed in the alloying process. In the case of the Comparative examples 15 and 16, however, the thin coating layer did not also have a sufficient thickness to improve corrosion resistance.

From the XRD test results of the test samples prepared according to the present invention, it was revealed that the Inventive steel sheets have a conductive metal diffusion layer (alloy phase) formed inside the zinc coating layer, and also have an alloy phase formed between the steel sheet and the zinc coated layer.

While the present invention has been shown and described in connection with the exemplary embodiments, it will be apparent to those skilled in the art that modifications and variations can be made without departing from the spirit and scope of the invention as defined by the appended claims.

The invention claimed is:

1. A process of manufacturing a zinc alloy coated steel sheet having good sealer adhesion and corrosion resistance, the method comprising:
    depositing a zinc/metal alloy coating layer onto a zinc coated steel sheet of an electro-galvanized steel sheet or a hot-dip galvanized steel sheet to form a layered coating where the zinc/metal alloy coating layer is present at an outermost surface of the coating; and
    thermally treating the zinc coated steel sheet having the layered coating with the zinc/metal alloy coating layer at the outermost surface at a temperature from 250 degrees Celsius (° C.) or above to less than 300° C. for 3 to 100 seconds,
    wherein depositing the zinc/metal alloy coating layer is carried out with an alloy material composed of 90-95% by weight of at least one conductive metal selected from the group consisting of Mg, Al, Mn, Cr, Cu, Ti, and Ni, and 5-10% by weight of Zn in a vacuum chamber by using a physical vapor deposition (PVD) method using an electrostatic levitator, and the zinc/metal alloy coating layer has a gradient zinc content decreasing from a surface of the zinc coated steel sheet,
    wherein, the thermally treated zinc alloy coated steel sheet comprises a zinc coating layer formed on a steel sheet and a zinc/metal alloy layer formed by the diffusion of the metal on the zinc coating layer, and
    a zinc/iron alloy phase is not present in an interface between the steel sheet and the zinc coating layer.

2. The process of claim 1, wherein the depositing of the zinc/metal alloy onto the zinc coated steel sheet is performed by levitation of a zinc/conductive metal alloy under a vacuum of $1\times10^{-2}$ to $1\times10^{-5}$ mbar by using an AC magnetic field.

3. The process of claim 2, wherein a zinc coating layer has a thickness of 1.4 to 5 micrometers, the zinc/metal alloy deposited layer has a thickness of 0.1 to 1 micrometers, and a zinc/metal alloy layer formed between the zinc coated layer and zinc/metal alloy deposited layer by the thermal treatment extends into the zinc coating layer and the zinc/metal alloy deposited layer.

4. The process of claim 1, wherein a zinc coating layer has a thickness of 1.4 to 5 micrometers, the zinc/metal alloy deposited layer has a thickness of 0.1 to 1 micrometers, and a zinc/metal alloy layer formed between the zinc coated layer and zinc/metal alloy deposited layer by the thermal treatment extends into the zinc coating layer and the zinc/metal alloy deposited layer.

5. A process of manufacturing a zinc alloy coated steel sheet having good sealer adhesion and corrosion resistance, the method comprising:
    depositing a zinc/metal alloy onto a zinc coated steel sheet of an electro-galvanized steel sheet or a hot-dip galvanized steel sheet to form a zinc/metal alloy deposited layer; and
    thermally treating the zinc coated steel sheet with the zinc/metal alloy deposited layer at a temperature from 250 degrees Celsius (° C.) or above to less than 300° C. for 3 to 100 seconds,
    wherein depositing the zinc/metal alloy coating layer is carried out with an alloy material composed of 90-95% by weight of at least one metal and 5-10% by weight of Zn in a vacuum chamber by using a physical vapor deposition (PVD) method using an electrostatic levitator, and the zinc/metal alloy coating layer has a gradient zinc content decreasing from a surface of the zinc coated steel sheet,
    wherein the thermally treated zinc alloy coated steel sheet comprises a zinc coating layer formed on a steel sheet and a zinc/metal alloy layer formed by the diffusion of the metal on the zinc coating layer,
    a zinc/iron alloy phase is not present in an interface between the steel sheet and the zinc coating layer, and the metal is selected from the group consisting of Al, Mn, Cr, Cu, Ti, and Ni.

* * * * *